United States Patent
Ko (10) Patent No.: US 9,537,489 B1
(45) Date of Patent: Jan. 3, 2017

(54) LEVEL SHIFTER WITH DYNAMIC BIAS TECHNIQUE UNDER OVERSTRESS VOLTAGE

(71) Applicant: NOVATEK Microelectronics Corp., Hsin-Chu (TW)

(72) Inventor: Po-Yao Ko, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 15/135,530

(22) Filed: Apr. 21, 2016

(51) Int. Cl.
*H03L 5/00* (2006.01)
*H03K 19/0185* (2006.01)

(52) U.S. Cl.
CPC .............................. *H03K 19/018521* (2013.01)

(58) Field of Classification Search
CPC ............................. H03K 3/012; H03K 19/0175
USPC ............. 327/333; 326/62, 63, 80, 81, 64–79
See application file for complete search history.

(56) References Cited

U.S. PATENT DOCUMENTS

| | | | | |
|---|---|---|---|---|
| 2002/0075053 | A1* | 6/2002 | Ganesan | H03K 3/0375 327/218 |
| 2003/0146776 | A1* | 8/2003 | Nakase | H03K 19/00361 326/33 |
| 2012/0268182 | A1* | 10/2012 | Lee | H03K 3/356121 327/199 |

OTHER PUBLICATIONS

Rajapandian, High-Tension Power Delivery: Operating 0.18um CMOS Digital Logic at 5.4V, ISSCC 2005 / Session 16 / Clock Distribution and Power Management / 16.4, Feb. 8, 2005.
Kossel, A 5.7mW/Gb/s 24-to-240ohm 1.6Gb/s Thin-Oxide DDR Transmitter with 1.9-to-7.6V/ns Clock-Feathering Slew-Rate Control in 22nm CMOS, ISSCC 2013 / Session 17 / High-Performance DRAM Interfaces / 17.3, Feb. 20, 2013.
Rajapandian, High-Voltage Power Delivery Through Charge Recycling, IEEE Journal of Solid-State Circuits, vol. 41, No. 6, Jun. 2006.

* cited by examiner

*Primary Examiner* — Lincoln Donovan
*Assistant Examiner* — Thomas Skibinski
(74) *Attorney, Agent, or Firm* — Winston Hsu; Scott Margo (57) ABSTRACT

A level shifter for converting a first voltage range to a second voltage range includes a latch circuit, a stack device and a dynamic bias circuit. The latch circuit is used for outputting the second voltage range. The stack device, coupled to the latch circuit, includes a stack transistor, which is used for sustaining the second voltage range of the latch circuit. The dynamic bias circuit, coupled to the stack device, is used for turning on the stack transistor to toggle the latch circuit.

12 Claims, 11 Drawing Sheets

|  | V1 | V2 | V3 | V4 |
|---|---|---|---|---|
| PH0 | 1.8V | 0V | 1.8V | 0V |
| PH1 | 0V | 0V | 1.8V | 0V |
|  | 0V | 1.8V | 1.8V | 0V |
| PH2 | 0V | 1.8V | 0V | 0V |
|  | 0V | 1.8V | 0V | 1.8V |

FIG. 12

LEVEL SHIFTER WITH DYNAMIC BIAS TECHNIQUE UNDER OVERSTRESS VOLTAGE

BACKGROUND OF THE INVENTION

1. Field of the Invention

The present invention relates to a level shifter, and more particularly, to a high speed level shifter with a dynamic bias technique under overstress supply voltage.

2. Description of the Prior Art

With the advancement of semiconductor technology, the semiconductor devices become smaller and thinner. In the advanced process, the small transistors can only tolerate a low supply voltage, while the system power supply still remains at a higher level according to specification. For example, if a 1.5V double-data-rate type three (DDR3) memory system is operated in a process having 1.0V core devices and 1.8V I/O devices. The 1.0V core devices cannot be operated in 1.5V due to electrical overstress, which may reduce the robustness and reliability of the devices. The 1.8V I/O devices are not adaptive to 1.5V power supply since the insufficient supply voltage reduces the operating speed of the devices.

The problem is unavoidable since the operating voltage of the peripheral devices does not follow the reduction of tolerance voltage of the transistors in the advanced process. Presently, the transistors may be operated under 1V supply voltage, while the voltage supplied by a battery may be 3.3V. This tremendous voltage difference causes electrical overstress. Thus, there is a need to provide a circuit design to solve the overstress problem.

SUMMARY OF THE INVENTION

It is therefore an objective of the present invention to provide a level shifter, which is implemented with a dynamic bias technique to be applied to the overstress supply voltage.

The present invention discloses a level shifter, for converting a first voltage range to a second voltage range. The level shifter comprises a latch circuit, a stack device and a dynamic bias circuit. The latch circuit is used for outputting the second voltage range. The stack device, coupled to the latch circuit, comprises a stack transistor, which is used for sustaining the second voltage range of the latch circuit. The dynamic bias circuit, coupled to the stack device, is used for turning on the stack transistor to toggle the latch circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
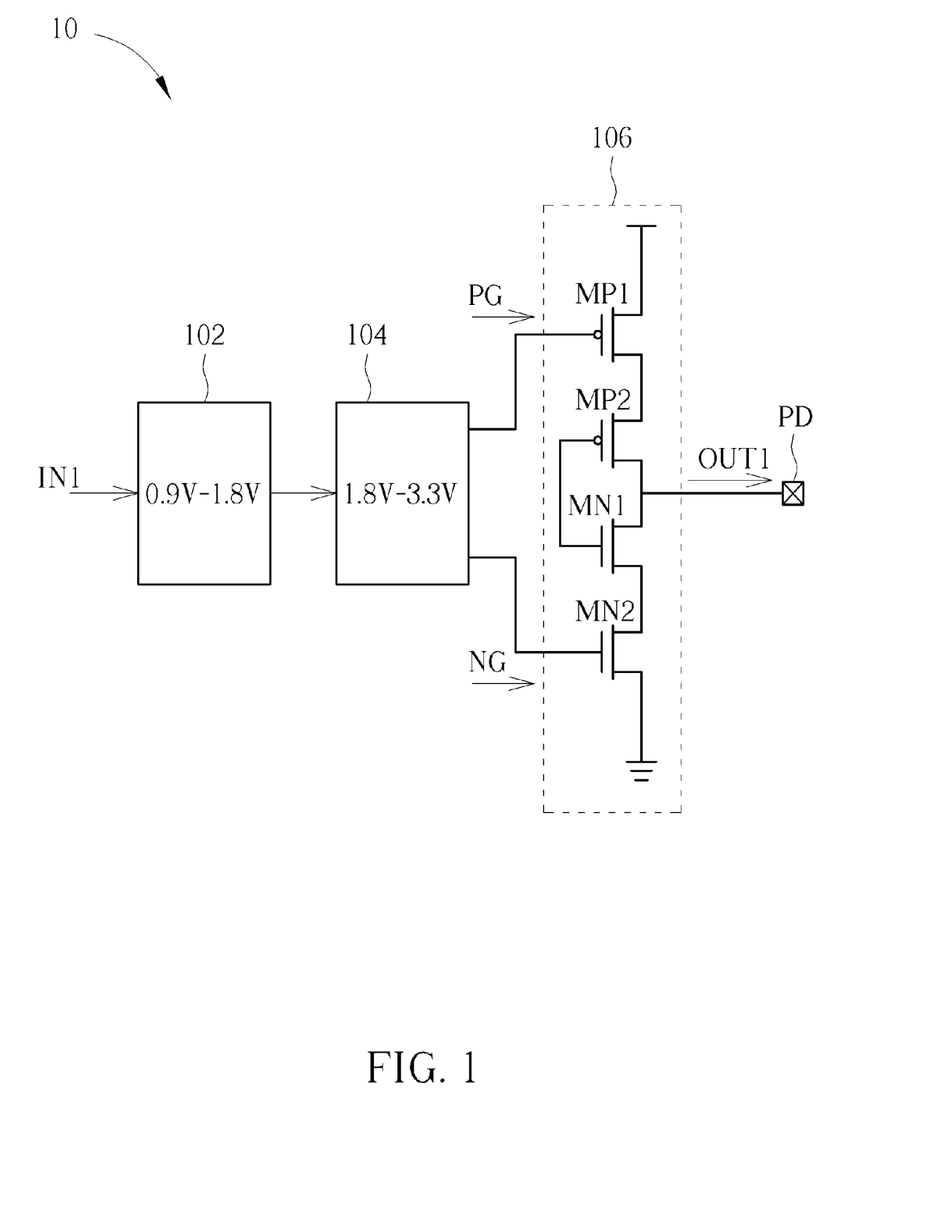
FIG. 1 is a schematic diagram of a general purpose input/output (GPIO) circuit with an output voltage level higher than an input voltage level.
Figure 2:
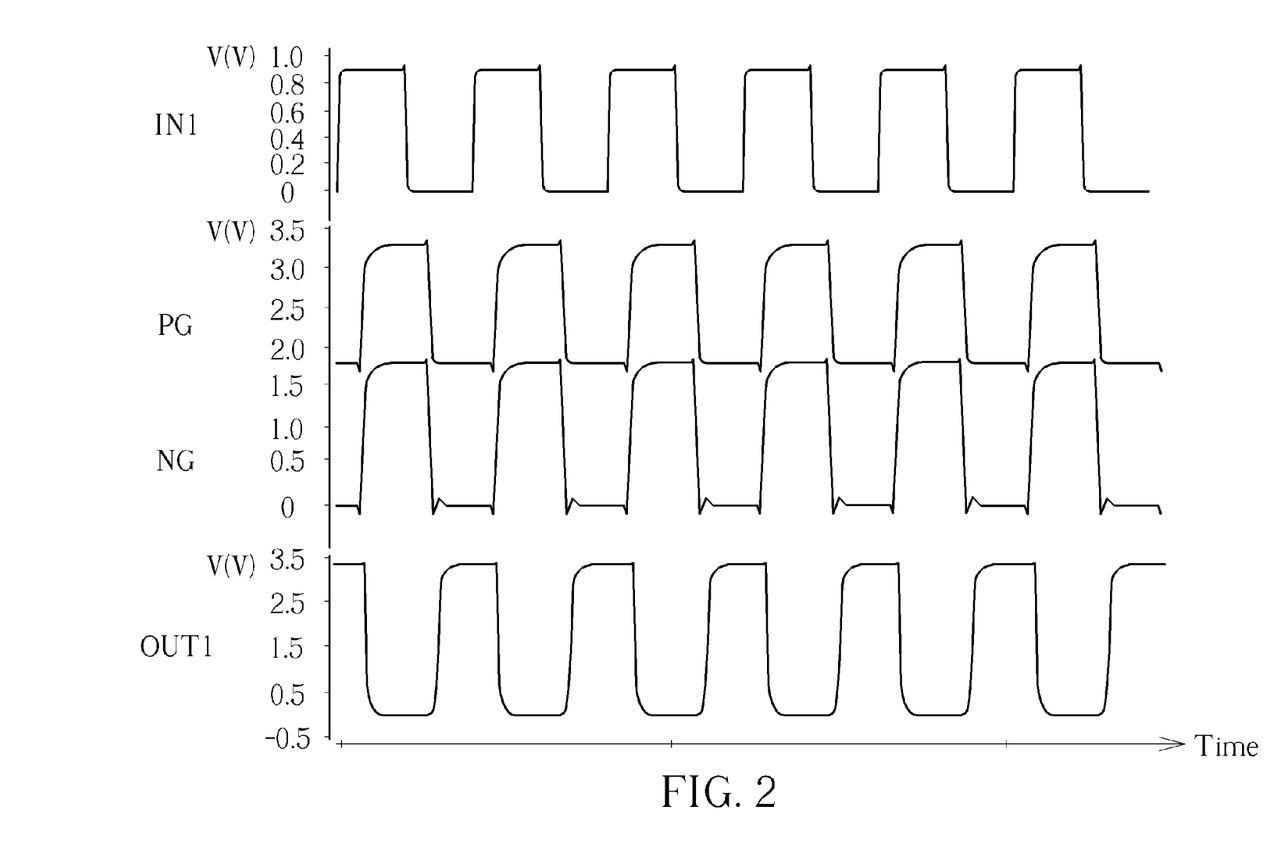
FIG. 2 is a waveform diagram of signals in the GPIO circuit.

In order to prevent the overstress problem, several circuit design techniques with level shifters are implemented. Please refer to FIG. 1, which is a schematic diagram of a general purpose input/output (GPIO) circuit 10 with an output voltage level higher than an input voltage level. As shown in FIG. 1, the GPIO circuit 10, which is implemented in a process having 0.9V core devices and 1.8V I/O devices, is required to output an output signal OUT1 with a voltage level 3.3V on a pad PD. The GPIO circuit 10 includes level shifters 102 and 104 and an output stage 106 including four transistors MP1, MP2, MN1 and MN2. The level shifter 102 receives an input signal IN1 and converts the voltage domain from 0.9V to 1.8V, which is easily implemented by the core devices and I/O devices in the process. Subsequently, the level shifter 104 converts the voltage domain from 1.8V to 3.3V and outputs the voltage level 3.3V to the output stage 106. In order to prevent overstress from influencing the robustness and reliability of the transistors in the output stage, the level shifter 104 divides the 3.3V voltage into two domains. That is, the level shifter 104 may output a signal PG swinging from 1.8V to 3.3V to the transistor MP1 and a signal NG swinging from 0V to 1.8V to the transistor MN2. With the stack transistors MP2 and MN1 implemented in the output stage 106, the overstress problem may not appear in the output stage 106. Exemplary signal waveforms of the GPIO circuit 10 are illustrated in FIG. 2.

Note that the transistors in the level shifter 104 should also be implemented to prevent the overstress problem under the 3.3V voltage level. Please refer to FIG. 3, which is a schematic diagram of a general implementation of the level shifter 104. The level shifter 104, which is used for converting a voltage range 0V-1.8V to another voltage range 1.8V-3.3V, includes a latch circuit 302, a stack device 304 and an input stage 306. The latch circuit 302 is a common latch including two inverters, where the output terminal of one inverter is connected to the input terminal of the other inverter. The latch circuit 302 is used for outputting the voltage range 1.8V-3.3V. The input stage 306 includes two inverters connected in series, for receiving an input signal IN2 and providing a voltage signal swinging from 0V to 1.8V. The stack device 304, coupled between the latch circuit 302 and the input stage 306, includes four stack transistors MP3, MP4, MN3 and MN4. The stack device 304 allows the latch circuit 302 to be operated above the voltage level 1.8V and thereby sustains the voltage range 1.8V-3.3V of the latch circuit 302. As can be seen from the circuit structure of the level shifter 104 shown in FIG. 3 and the GPIO circuit 10 of FIG. 1, the level shifter 104 may output the signal PG on the node N6 and output the signal NG on the node N2.

Figure 3:
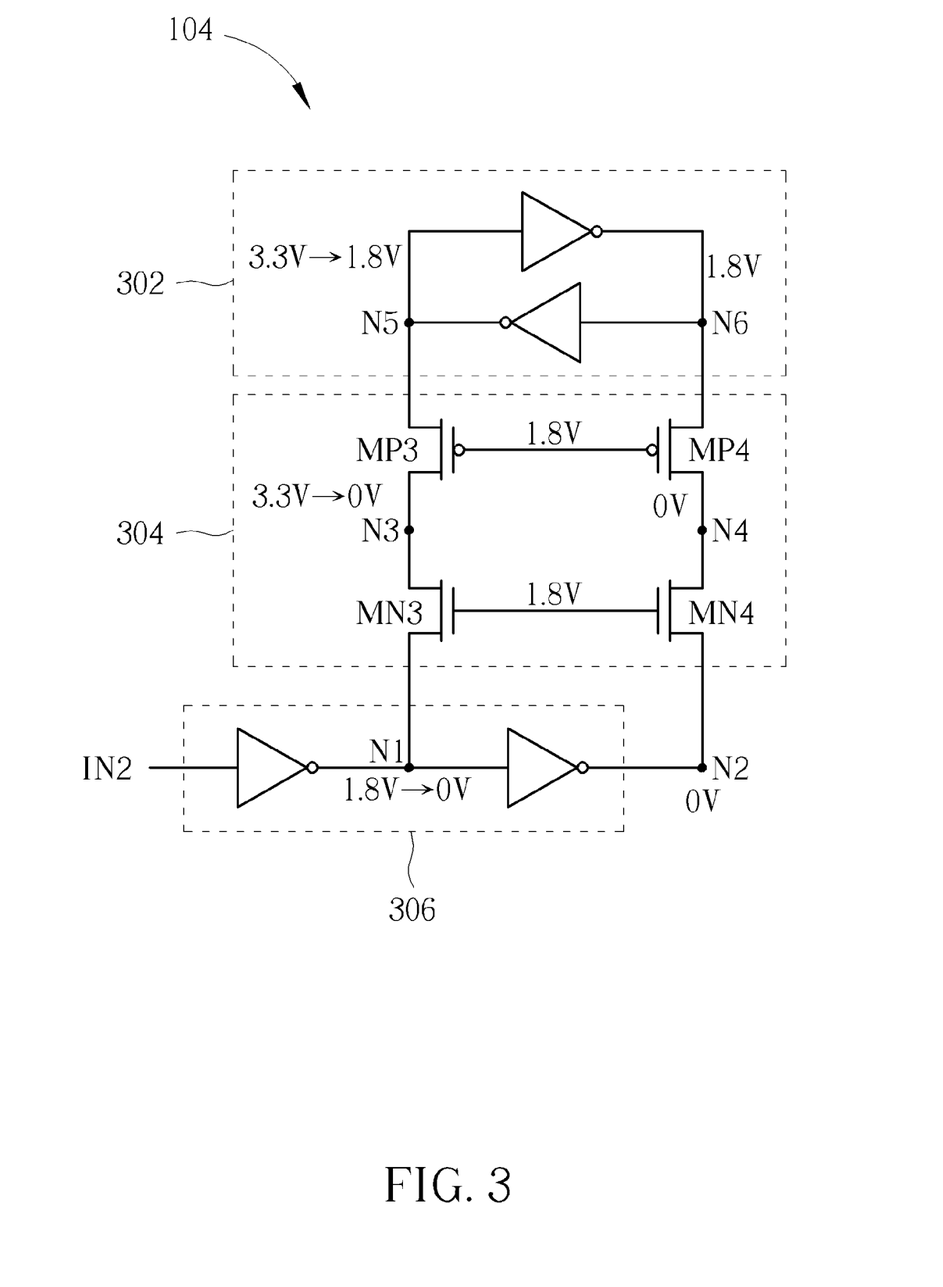
FIG. 3 is a schematic diagram of a general implementation of the level shifter shown in FIG. 1.

In detail, the transistors MP3, MP4, MN3 and MN4 in the stack device 304 are biased by a constant voltage 1.8V. The 1.8V bias voltage of the transistors MP3 and MP4 turns off the transistors MP3 and MP4 when their source voltages fall down to near 1.8V; hence, the voltage of the latch circuit 302 cannot fall below 1.8V since the transistors MP3 and MP4 are turned off to isolate the voltage domain. Therefore, the transistors in the latch circuit 302 are operated within the voltage range from 1.8V to 3.3V and the overstress may not appear in the latch circuit 302. In other words, the transistors MP3 and MP4 are turned off to sustain the voltage range of the latch circuit 302. The 1.8V bias voltage of the transistors MN3 and MN4 turns off the transistors MN3 and MN4 when their source voltages rise up to near 1.8V; hence, the voltage of the input stage 306 cannot rise above 1.8V since the transistors MN3 and MN4 are turned off to isolate the voltage domain. Therefore, the transistors in the input stage 306 are operated within the voltage range from 0V to 1.8V and the overstress may not appear in the input stage 306. In addition, the gate voltages of the transistors MP3, MP4, MN3 and MN4 rise or fall with the signal from the input stage 306 and also correspond to the signal in the latch circuit 302, so the overstress may not appear in the stack device 304.

Please keep referring to FIG. 3. In one stable status where the input signal IN2 is equal to 0V, the voltages of the nodes N1, N3 and N5 are 1.8V, 3.3V and 3.3V, respectively, and the voltages of the nodes N2, N4 and N6 are 0V, 0V and 1.8V, respectively. If the input signal IN2 changes to 1.8V, the voltage of the node N1 becomes 0V, which rapidly pulls down the voltage of the node N3 to 0V and the voltage of the node N5 to 1.8V. In such a condition, both of the transistors MP3 and MP4 are turned off since both of the voltages of the nodes N5 and N6 are 1.8V, and the latch circuit 302 is operated in a metastable status. After the voltage of the node N2 changes to 1.8V, the node N6 may not react immediately since the transistor MP4 is turned off. Therefore, the voltage of the node N6 may rise to 3.3V slowly, which limits the operating speed of the level shifter 104.

Figure 4:
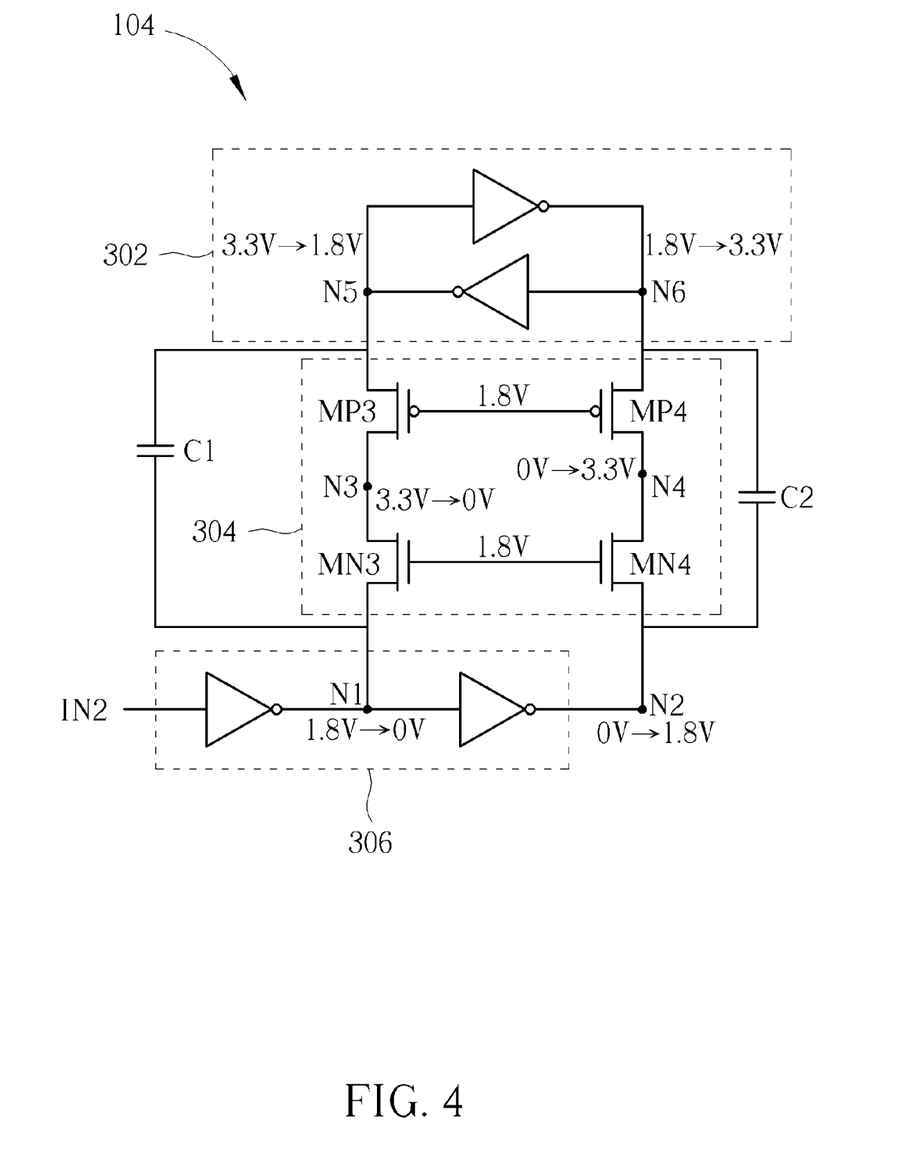
FIG. 4 is a schematic diagram of a level shifter implemented with capacitors.

Several methods have been developed to solve this problem. Please refer to FIG. 4, which is a schematic diagram of a level shifter 40 implemented with capacitors C1 and C2. The circuit structure of the level shifter 40 is similar to the circuit structure of the level shifter 104, so the signals and elements having similar functions are denoted by the same symbols. As shown in FIG. 4, the main difference between the level shifter 40 and the level shifter 104 is that, the level shifter 40 further includes two capacitors C1 and C2. The capacitor C1 is coupled between the nodes N1 and N5, and the capacitor C2 is coupled between the nodes N2 and N6. When the node N1 changes from 0V to 1.8V, the charges stored in the capacitor C1 may push the node N5 to a higher voltage and thereby break the metastable status. Therefore, the voltage of the node N5 may rise immediately. When the node N2 changes from 0V to 1.8V, the charges stored in the capacitor C2 may push the node N6 to a higher voltage and thereby break the metastable status. Therefore, the voltage of the node N6 may rise immediately. However, in order to achieve enough voltage coupling capability, the capacitors C1 and C2 should possess enough capacitance values and thus require a larger circuit area, which increases the circuit cost. In addition, the parasitic capacitors of the transistors MP4 and MN4 and those in the parasitic capacitors of the transistors in the latch circuit 302, the stack device 304 and the input stage 306 reduce the efficiency of the capacitors C1 and C2. Therefore, it is necessary to provide a more satisfactory and cost effective method to implement the level shifter.

The present invention introduces a dynamic bias technique to increase the operating speed of the level shifter. More specifically, in a level shifter such as the level shifter shown in FIG. 3, the PMOS transistors in the stack device (e.g., the transistors MP3 and MP4) are biased by a dynamic signal rather than a constant voltage.

Figure 5:
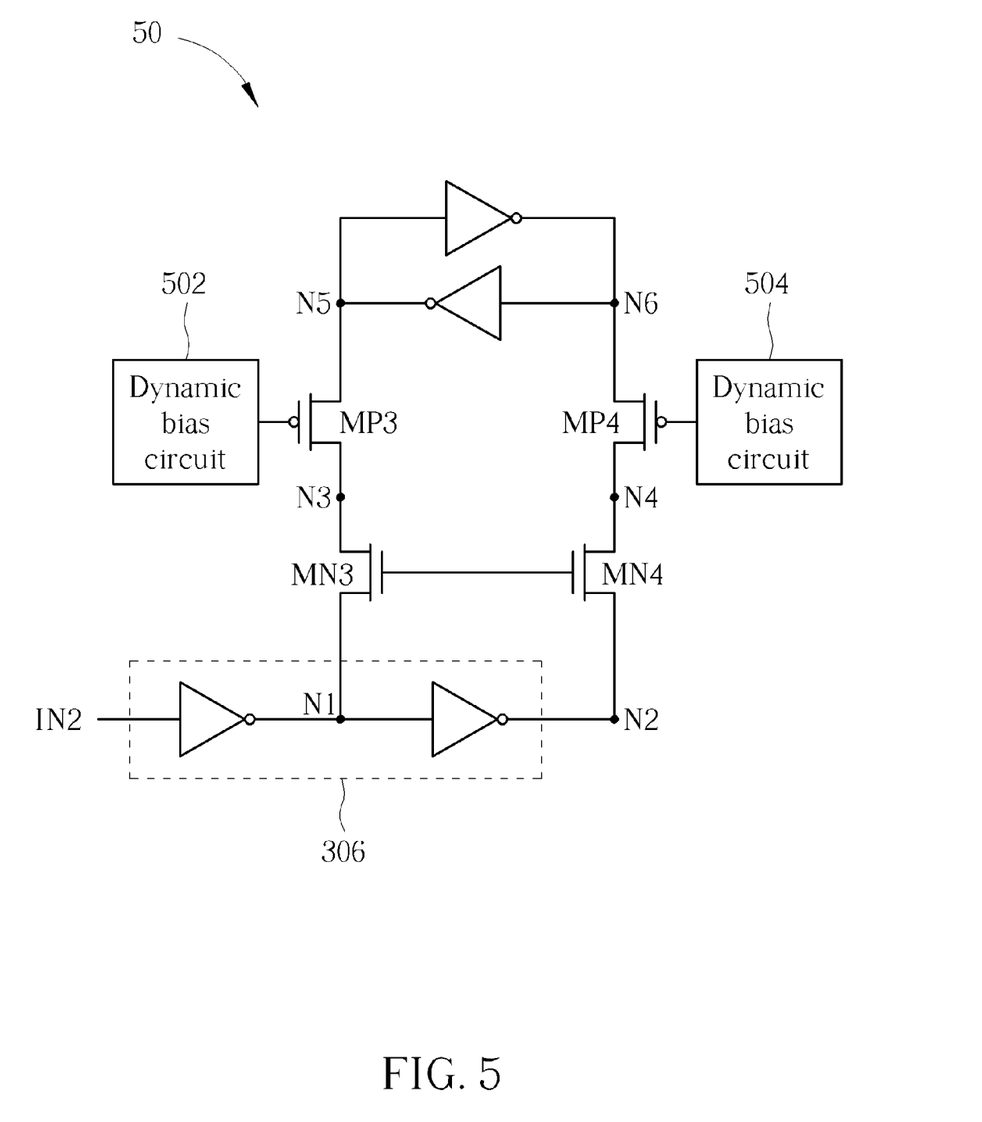
FIG. 5 is a schematic diagram of a level shifter according to an embodiment of the present invention.

Please refer to FIG. 5, which is a schematic diagram of a level shifter 50 according to an embodiment of the present invention. The circuit structure of the level shifter 50 is similar to the circuit structure of the level shifter 104, so the signals and elements having similar functions are denoted by the same symbols. As shown in FIG. 5, the main difference between the level shifter 50 and the level shifter 104 is that, the transistors MP3 and MP4 in the level shifter 50 are biased by dynamic bias circuits 502 and 504, respectively, while the transistors MP3 and MP4 in the level shifter 104 are biased by a constant voltage 1.8V. Each of the dynamic bias circuits 502 and 504 may be implemented as a pulse generator, for outputting a pulse signal to the gate terminal of the transistor MP3 or MP4, in order to turn on the transistor MP3 or MP4 for a short period. As mentioned above, in the level shifter 104, the voltages on the nodes N5 and N6 rise/fall slowly and the status of the latch circuit 302 changes slowly in response to the input signal IN2. In comparison, in the level shifter 50, the transistors MP3 and MP4 are turned on for a short period to toggle the latch circuit 302 to change its status, so the operating speed of the level shifter 50 may be increased significantly. Note that the short period of turning on the transistor MP3 or MP4 may be far shorter than a cycle of data dealt with by the level shifter 50. An extremely short turn-on period is enough to toggle the latch circuit 302 to break its metastable status.

Figure 6A:
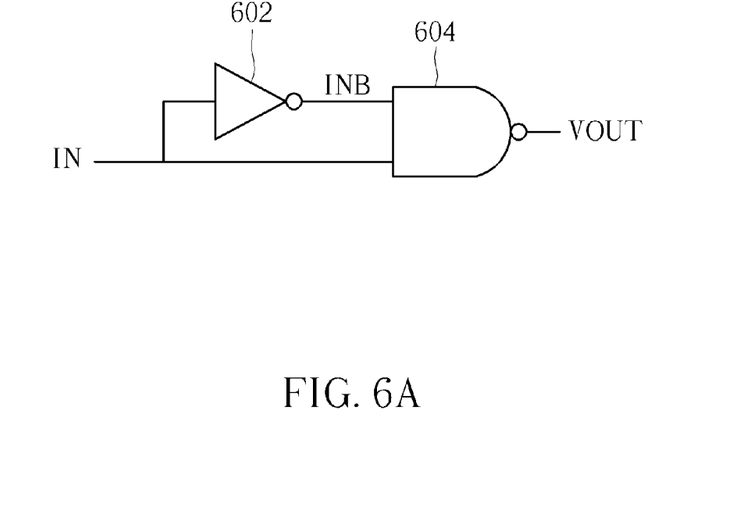
FIG. 6A is a schematic diagram of an implementation of the dynamic bias circuit shown in FIG. 5.
Figure 6B:
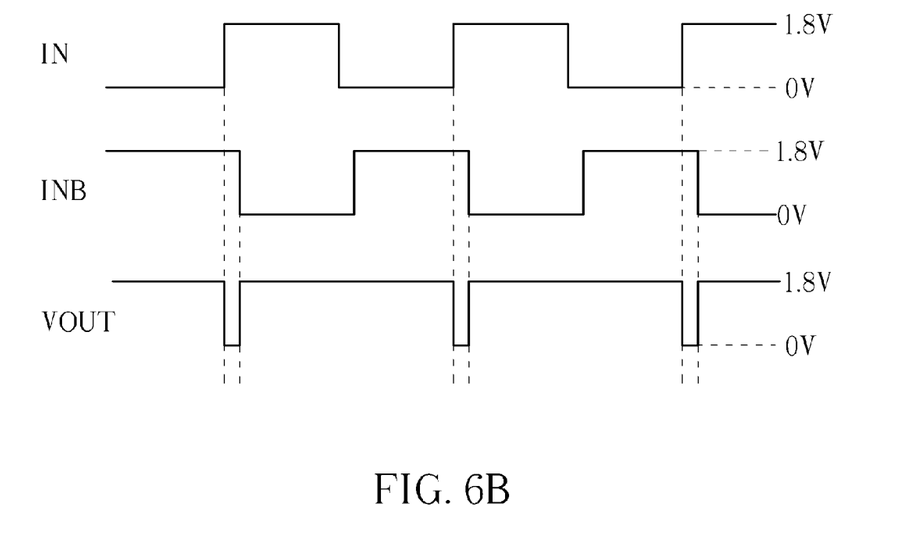
FIG. 6B illustrates waveforms of the signals in the dynamic bias circuit shown in FIG. 5.

Please refer to FIGS. 6A and 6B. FIG. 6A is a schematic diagram of an implementation of the dynamic bias circuit 502 or 504. FIG. 6B illustrates waveforms of the signals in the dynamic bias circuit 502 or 504. As shown in FIG. 6A, the dynamic bias circuit includes an inverter 602 and a NAND gate 604. The inverter 602 receives an input signal IN and outputs a signal INB. The two input terminals of the NAND gate 604 respectively receive the input signal IN and the signal INB, and the output terminal of the NAND gate 604 outputs an output signal VOUT. As shown in FIG. 6B, with the delay of the inverter 602, the output signal VOUT may be a pulse signal, and the pulse length of the pulse signal is equal to the delay of the inverter 602. This pulse signal can therefore be used for turning on the transistors MP3 and MP4 in the level shifter 50 for a short period. Note that the dynamic bias circuit shown in FIG. 6A is only one of various implementations of the present invention, those skilled in the art may generate the pulse signal by other methods. For example, similar pulse signals may be generated by using an inverter connected with a NOR gate, or more inverters may be included to adjust the pulse length.

Figure 7:
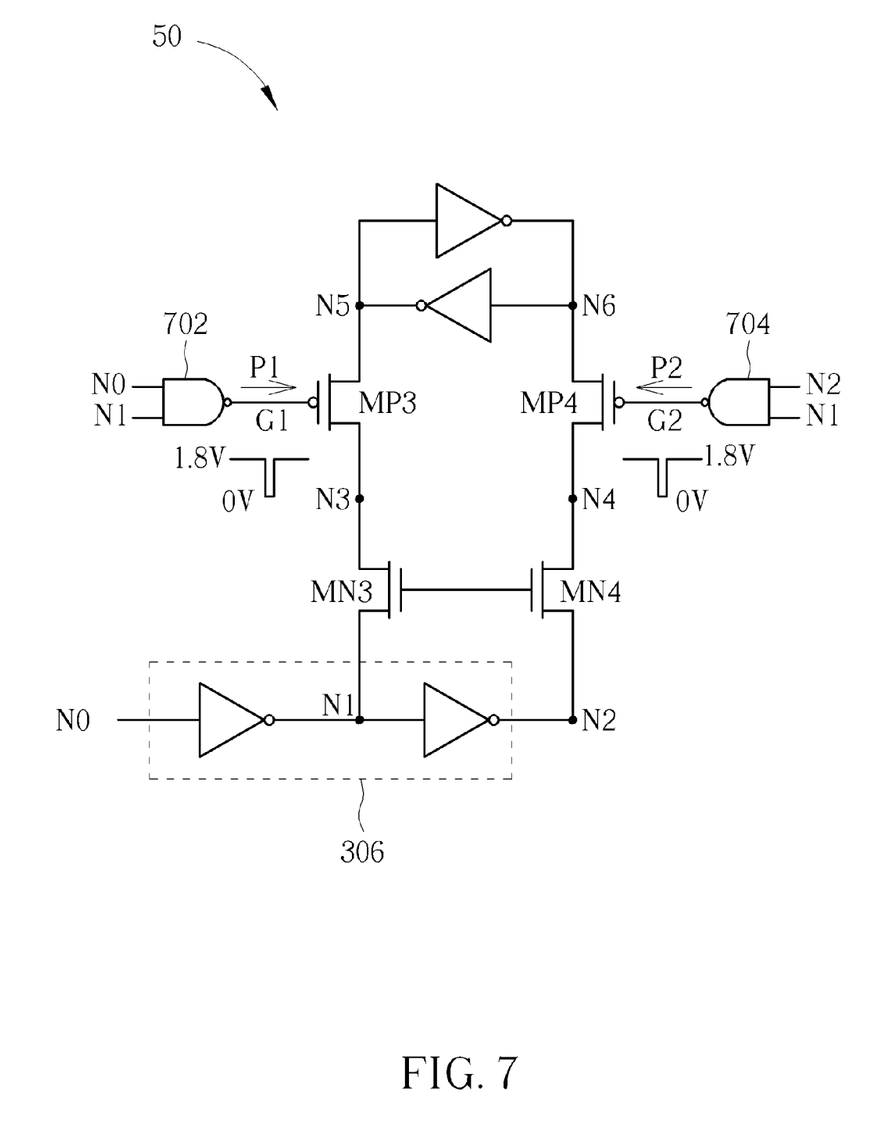
FIG. 7 is an implementation of the level shifter shown in FIG. 5.

Please refer to FIG. 7, which is an implementation of the level shifter 50. In this embodiment, the dynamic bias circuit is integrated with the input stage to save the circuit area and cost. In detail, the input terminals of the NAND gate 702 are respectively coupled to the input node N0 and the node N1, and the NAND gate 702 generates a pulse signal P1 on the node G1. The input terminals of the NAND gate 704 are respectively coupled to the nodes N1 and N2, and the NAND gate 704 generates a pulse signal P2 on the node G2.

Figure 8:
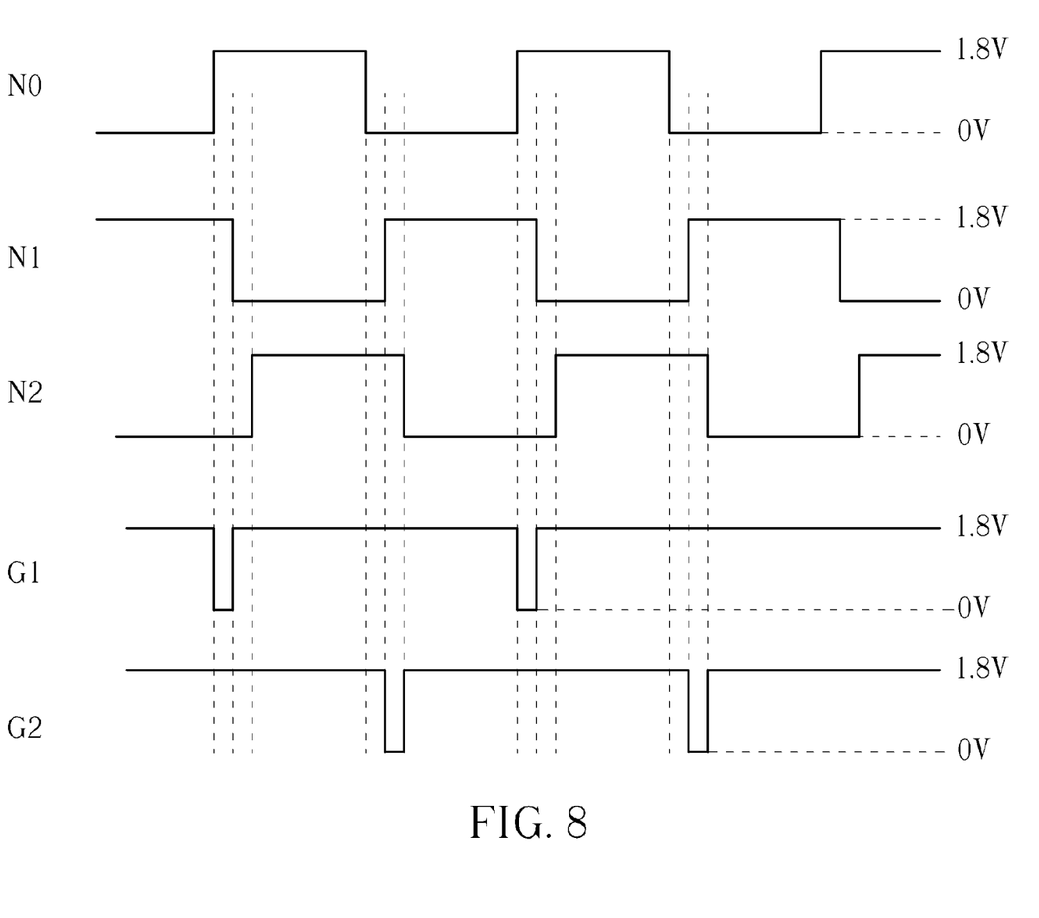
FIG. 8 is a waveform diagram illustrating the operations of the dynamic bias circuit.

Detailed waveforms related to the operations of this dynamic bias circuit are illustrated in FIG. 8.

In detail, the pulse signal P1 turns on the transistor MP3 when the voltage of the node N1 tends to change to 0V. At this moment, the voltage of the node N5 falls down rapidly, and then immediately returns to 1.8V after the transistor MP3 is turned off. The rapid falling of the voltage of the node N5 triggers the voltage of the node N6 to rise to the high voltage level, e.g., 3.3V. On the other hand, the pulse signal P2 turns on the transistor MP4 when the voltage of the node N2 tends to change to 0V. At this moment, the voltage of the N6 falls down rapidly, and then immediately returns to 1.8V after the transistor MP4 is turned off. The rapid falling of the voltage of the node N6 triggers the voltage of the node N5 to rise to the high voltage level, e.g., 3.3V. In this manner, the transistors MP3 and MP4 are turned on alternately, to toggle the latch circuit 302 to change its status in each data change period.

Figure 9:
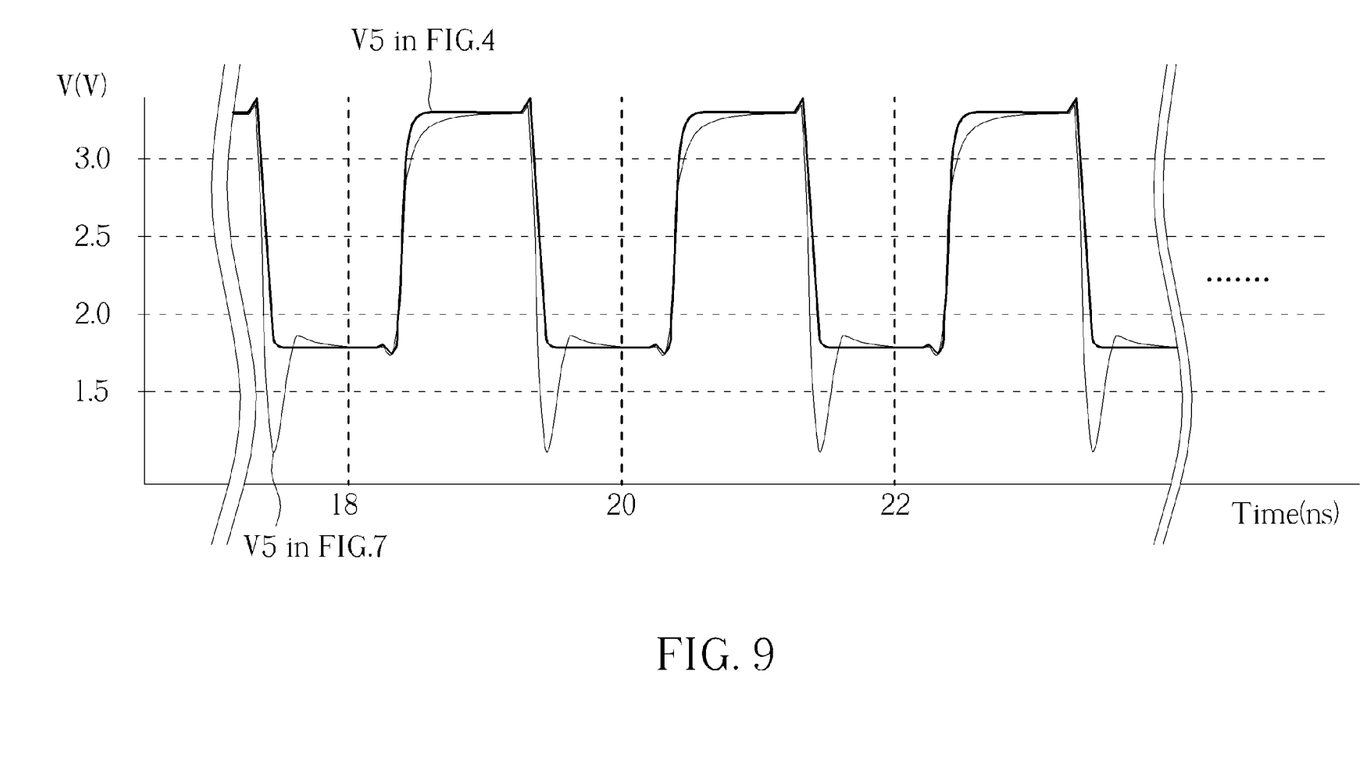
FIG. 9 is a waveform diagram of the voltage of the node in the latch circuit.

Please refer to FIG. 9, which is a waveform diagram of the voltage of the node N5 in the latch circuit 302 (called V5 hereinafter). FIG. 9 illustrates a comparison of the voltage V5 in the circuit structure shown in FIG. 4 and FIG. 7. A signal is transmitted in a high speed with a data rate equal to 1 gigahertz (GHz), where a data cycle is equal to 1 nanosecond (ns). In FIG. 4, the latch circuit 302 is toggled via the capacitors C1 and C2. In FIG. 7, the latch circuit 302 is toggled by turning on the stack transistors MP3 and MP4 for a short period via the dynamic bias circuit. These two methods may achieve similar operating speed, where the dynamic bias circuit provided by the present invention is implemented via logic gates such as a NAND gate and an inverter, which have a smaller size and can be integrated with the input stage to save more circuit area. Note that the voltage V5 in FIG. 7 of the present invention has a tail in each period. This tail, which is generated by turning on the stack transistor in a short period, is short and may not influence the robustness and reliability of the circuit elements due to the overstress. As shown in FIG. 9, the tail width indicates that the short period of turning on the stack transistor is approximately equal to 100 picoseconds, so that the level shifter of the present invention is able to operate in a high speed such as 1 GHz or higher.

Please note that the present invention aims at providing a dynamic bias circuit to generate a dynamic bias signal, e.g., a pulse signal, for the stack transistor. Those skilled in the art can make modifications and alternations accordingly. For example, the circuit structure shown in FIG. 7 is one of various implementations of the present invention, where the pulse signal is outputted to the gate terminal of the stack transistors MP3 and MP4. In another embodiment, the PMOS transistors MP3 and MP4 may be omitted in order to save the circuit area, and the dynamic bias signal may be outputted to the source terminal of the NMOS transistors MN3 and MN4.

Figure 10:
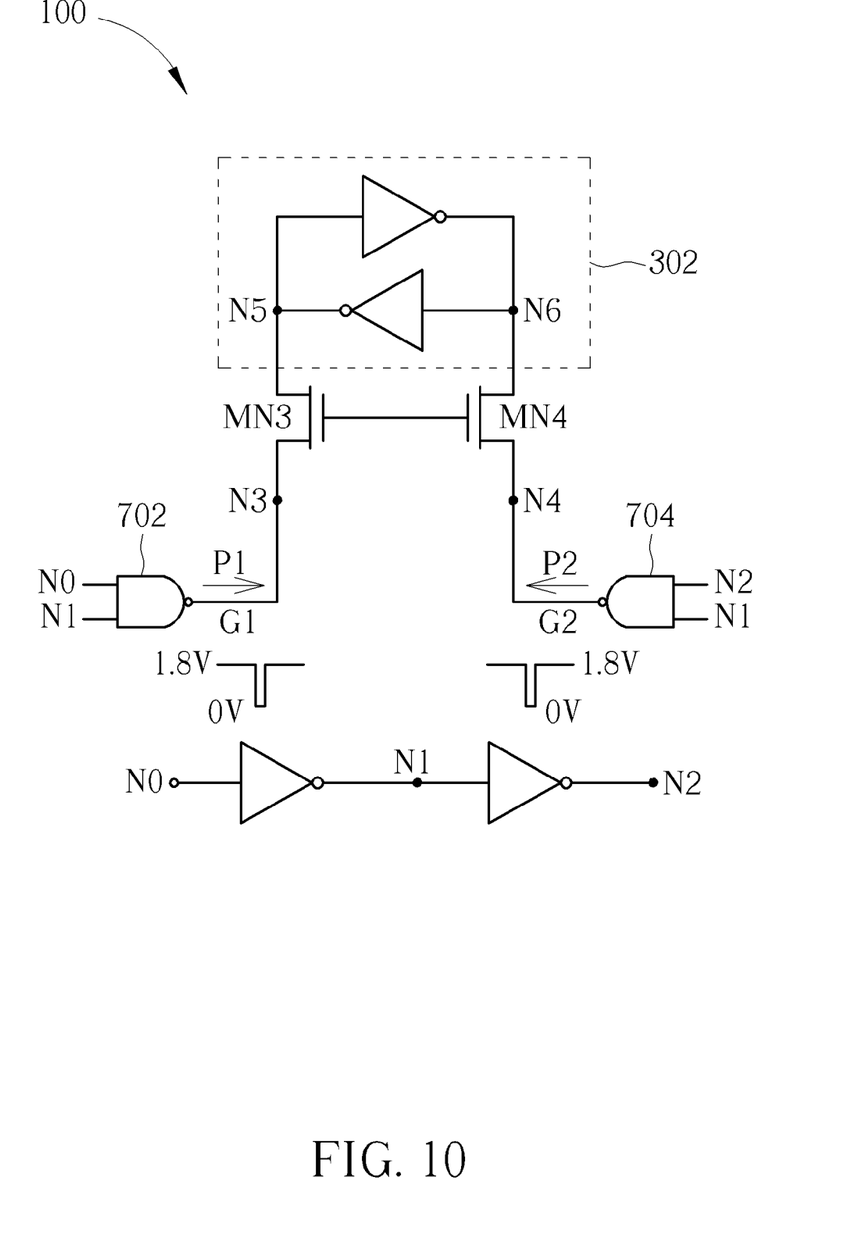
FIG. 10 is a schematic diagram of another level shifter according to an embodiment of the present invention.

In detail, please refer to FIG. 10, which is a schematic diagram of another level shifter 100 according to an embodiment of the present invention. The circuit structure of the level shifter 100 is similar to the circuit structure of the level shifter 50, so the signals and elements having similar functions are denoted by the same symbols. As shown in FIG. 10, the main difference between the level shifter 100 and the level shifter 50 is that, in the level shifter 100, the PMOS transistors MP3 and MP4 are omitted and the dynamic bias circuits, i.e., the NAND gates 702 and 704, are coupled to the source terminal of the NMOS transistors MN3 and MN4. Similar to the operations in the level shifter 50, in the level shifter 100, the pulse signals outputted by the NAND gates 702 and 704 may turn on the transistors MN3 and MN4 respectively and alternately, to toggle the latch circuit 302 to change its status in every data change period.

Figure 11:
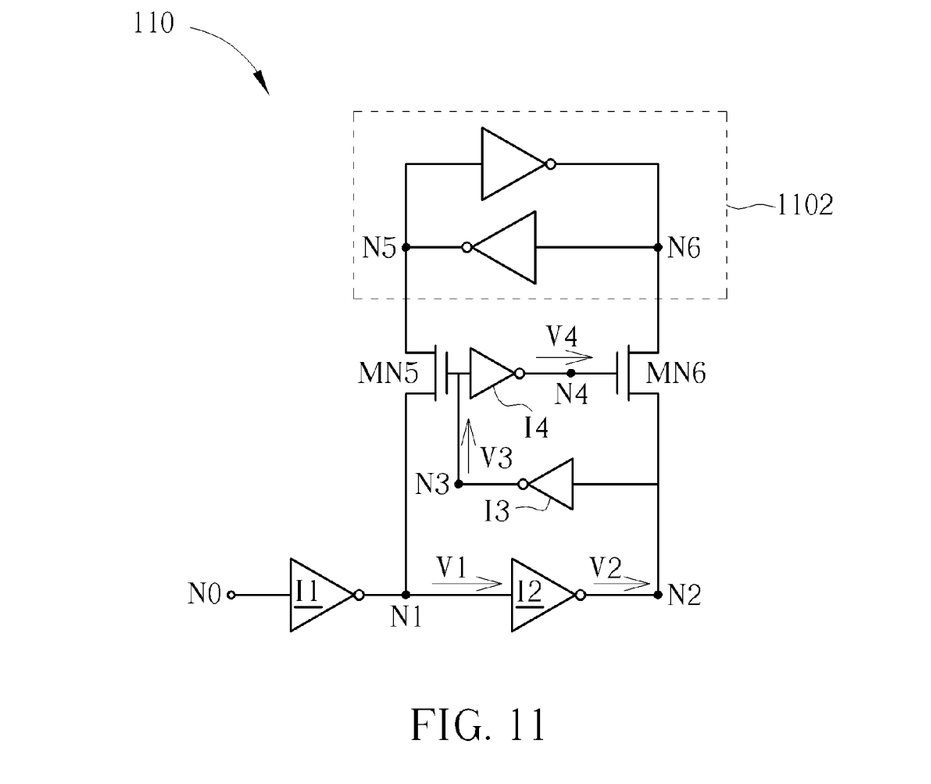
FIG. 11 is a schematic diagram of a further level shifter.

In a further embodiment, the dynamic bias circuit is implemented by an asymmetric sequential bias technique, which may be realized by a delay chain composed of a plurality of inverters. Please refer to FIG. 11, which is a schematic diagram of a further level shifter 110. As shown in FIG. 11, the level shifter 110 includes a latch circuit 1102, stack transistors MN5 and MN6, and a delay chain composed of inverters I1-I4. In the delay chain, the inverters I1-I4 are coupled in series and output voltage signals V1-V4 on nodes N1-N4, respectively. For the transistor MN5, the gate terminal of the transistor MN5 is coupled to the node N3 to receive the voltage signal V3, and the source terminal of the transistor MN5 is coupled to the node N1 to receive the voltage signal V1. Since the voltage signal V3 is delayed from the voltage signal V1, there may be a short period where the voltage V1 changes to a low voltage level, e.g., 0V, while the voltage V3 still remains at a high voltage level, e.g., 1.8V. Therefore, the transistor MN5 may be turned on for the short period. For the transistor MN6, the gate terminal of the transistor MN6 is coupled to the node N4 to receive the voltage signal V4, and the source terminal of the transistor MN6 is coupled to the node N2 to receive the voltage signal V2. Since the voltage signal V4 is delayed from the voltage signal V2, there may be a short period where the voltage V2 changes to a low voltage level, e.g., 0V, while the voltage V4 still remains at a high voltage level, e.g., 1.8V. Therefore, the transistor MN6 may be turned on for the short period. According to the operations of the delay chain, the transistors MN5 and MN6 may be turned on alternately, to toggle the latch circuit 1102 to change its status in each data change period.

Figure 12:
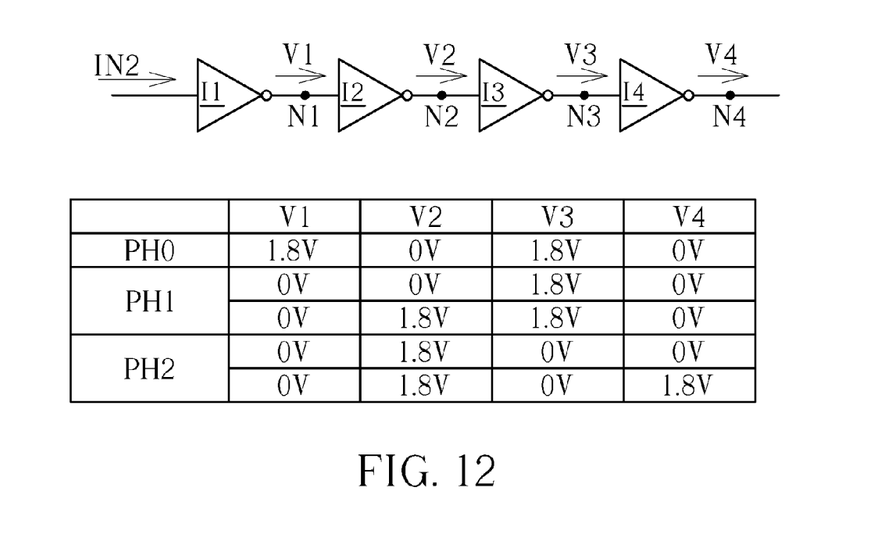
FIG. 12 is a schematic diagram of operations of the delay chain shown in FIG. 11.

In detail, please refer to FIG. 12, which is a schematic diagram of operations of the delay chain shown in FIG. 11. As shown in FIG. 12, in a stable initial status, the input voltage IN2 of the delay chain is 0V; hence, the voltages V1 and V3 are 1.8V and the voltages V2 and V4 are 0V (as the initial phase PH0). At this moment, the transistors MN5 and MN6 are turned off. Subsequently, the input voltage IN2 changes to 1.8V, so the voltage V1 changes to 0V, and then the voltage V2 changes to 1.8V (as the phase PH1). At this moment, the voltage V1 is 0V and the voltage V3 is 1.8V, so that the transistor MN5 is turned on, where the on-time of the transistor MN5 is determined based on the delay of the delay chain and may be configured to be a short time. Subsequently, the voltage V3 changes to 0V, and then the voltage V4 changes to 1.8V (as the phase PH2). At this moment, both of the transistors MN5 and MN6 are turned off.

In a similar manner, the voltage V2 changes to 0V from 1.8V before the voltage V4 changes to 0V from 1.8V due to the delay of the delay chain when the input voltage IN2 changes to 0V from 1.8V; hence, the transistor MN6 may also be turned on for a short period. The detailed operations may be known by those skilled in the art according to the above illustrations, and will not be narrated herein.

Please note that the above embodiments illustrate the situation where the voltage domain is converted from 1.8V to 3.3V. Those skilled in the art should know that the voltages 1.8V and 3.3V are only examples of voltage signals in the circuit. The level shifter of the present invention may also be applied to another voltage level, e.g., a conversion from 1.5V to 3V. As long as the target voltage exceeds the tolerance voltage of the transistors such that the transistors cannot be operated normally and reliably in the higher voltage after conversion, the level shifter of the present invention is applicable to prevent the overstress problem.

Please also note that in the embodiments of the present invention, the circuit elements used in the level shifter still do not have a higher tolerant voltage. However, these circuit elements are applicable in the higher voltage level due to the circuit design technique used in the level shifter provided in the present invention. For example, in an embodiment with voltage conversion from 1.8V to 3.3V, the circuit elements applied in the level shifter is only tolerable to 1.8V stress voltage but non-tolerable to 3.3V stress voltage. Therefore, it is feasible that a general 1.8V process can convert voltage level from 1.8V to 3.3V and output the 3.3V voltage.

To sum up, the present invention provides a level shifter implemented with a dynamic bias circuit. The dynamic bias circuit is capable of turning on the stack transistors in the level shifter for a short period, to toggle the latch circuit of the level shifter to change its status. In an embodiment, the dynamic bias circuit may be realized by a pulse generator, to generate a pulse signal outputted to the source terminal or gate terminal of the stack transistors in the level shifter, in order to turn on the stack transistors for a short period. In another embodiment, the dynamic bias circuit may be realized by a delay chain, to turn on the stack transistors for a short period based on the delay of the delay chain. As a result, the level shifter of the present invention may overcome the overstress problem and operate in higher speed without the usage of coupling capacitors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifter, for converting a first voltage range to a second voltage range, comprising:
    a latch circuit, for outputting the second voltage range;
    a stack device, coupled to the latch circuit, comprising a stack transistor for sustaining the second voltage range of the latch circuit; and
    a dynamic bias circuit, coupled to the stack device, for outputting a pulse signal to turn on the stack transistor to toggle the latch circuit;
    wherein the pulse signal has an extremely short width to prevent overstress occurring in the level shifter.

2. The level shifter of claim 1, wherein the dynamic bias circuit comprises a pulse generator.

3. The level shifter of claim 2, wherein the pulse generator outputs a pulse signal to a gate terminal of the stack transistor, to turn on the stack transistor.

4. The level shifter of claim 2, wherein the pulse generator outputs a pulse signal to a source terminal of the stack transistor, to turn on the stack transistor.

5. The level shifter of claim 2, wherein the pulse generator comprises an inverter, and a NAND gate or a NOR gate, to generate a pulse signal.

6. The level shifter of claim 5, wherein a pulse length of the pulse signal is equal to a delay of the inverter.

7. The level shifter of claim 1, wherein the stack device comprises a first stack transistor and a second stack transistor, controlled by a first pulse signal and a second signal, respectively.

8. The level shifter of claim 7, wherein the first stack transistor and the second stack transistor are turned on alternately.

9. The level shifter of claim 1, wherein the dynamic bias circuit comprises a delay chain.

10. The level shifter of claim 9, wherein a gate terminal of the stack transistor is coupled to a first terminal of the delay chain to receive a first signal, and a source terminal of the stack transistor is coupled to a second terminal of the delay chain to receive a second signal.

11. The level shifter of claim 10, wherein the first signal is delayed from the second signal.

12. The level shifter of claim 10, wherein the first signal and the second signal turn on the stack transistor.

* * * * *